United States Patent

Yoshikawa et al.

(10) Patent No.: US 9,765,190 B2
(45) Date of Patent: Sep. 19, 2017

(54) POLYSILSESQUIOXANE BASED ENCAPSULATING MATERIAL COMPOSITION FOR UV-LED AND USE OF PHOSPHORIC ACID BASED CATALYST THEREFOR

(71) Applicant: Sumitomo Chemical Company, Limited, Tokyo (JP)

(72) Inventors: Gaku Yoshikawa, Osaka (JP); Masayuki Takashima, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 15/112,300

(22) PCT Filed: Jan. 20, 2015

(86) PCT No.: PCT/JP2015/051946
§ 371 (c)(1),
(2) Date: Jul. 18, 2016

(87) PCT Pub. No.: WO2015/115344
PCT Pub. Date: Aug. 6, 2015

(65) Prior Publication Data
US 2016/0340474 A1    Nov. 24, 2016

(30) Foreign Application Priority Data
Jan. 31, 2014   (JP) ................. 2014-016595

(51) Int. Cl.
| | |
|---|---|
| C08G 77/08 | (2006.01) |
| C08G 77/18 | (2006.01) |
| C08L 83/04 | (2006.01) |
| H01L 33/56 | (2010.01) |
| C08G 77/04 | (2006.01) |

(52) U.S. Cl.
CPC .............. *C08G 77/18* (2013.01); *C08G 77/08* (2013.01); *C08L 83/04* (2013.01); *H01L 33/56* (2013.01); *C08G 77/045* (2013.01); *C08G 2190/00* (2013.01); *H01L 2933/005* (2013.01)

(58) Field of Classification Search
CPC ................................ C08G 77/18; C08G 77/08
See application file for complete search history.

(56) References Cited

U.S. PATENT DOCUMENTS

| | | | | |
|---|---|---|---|---|
| 4,885,186 A | * | 12/1989 | Bagley ...................... | C03C 1/00 427/162 |
| 6,368,535 B1 | * | 4/2002 | Katsoulis ............... | C08G 77/50 264/236 |
| 2007/0098958 A1 | * | 5/2007 | Katsoulis .............. | B29C 59/022 428/156 |
| 2010/0273937 A1 | | 10/2010 | Tajima et al. | |
| 2012/0058333 A1 | * | 3/2012 | Yamamoto ............. | C08G 77/16 428/336 |
| 2012/0211797 A1 | | 8/2012 | Saiki et al. | |
| 2012/0237781 A1 | * | 9/2012 | Dewald .................... | B32B 7/12 428/447 |
| 2013/0096249 A1 | | 4/2013 | Kawabata et al. | |
| 2013/0196248 A1 | * | 8/2013 | Kim ................... | H01M 8/1037 429/482 |

FOREIGN PATENT DOCUMENTS

| | | |
|---|---|---|
| JP | 2007112975 A | 5/2007 |
| JP | 2009215377 A | 9/2009 |
| JP | 2010254814 A | 11/2010 |
| JP | 2011202154 A | 10/2011 |
| WO | 2011145638 A1 | 11/2011 |

OTHER PUBLICATIONS

English language abstract, JP 2009-215377 (Sep. 2009).*

* cited by examiner

*Primary Examiner* — Margaret Moore
(74) *Attorney, Agent, or Firm* — Panitch Schwarze Belisario & Nadel LLP

(57) ABSTRACT

A phosphoric acid-based catalyst is used as a cure accelerator for a polysilsesquioxane-based UV-LED-encapsulating material, a cured product of which has a light transmittance of 65% or more at 260 nm. A polysilsesquioxane-based UV-LED-encapsulating material composition contains a polysilsesquioxane-based UV-LED-encapsulating material and a phosphoric acid-based catalyst.

12 Claims, 2 Drawing Sheets

POLYSILSESQUIOXANE BASED ENCAPSULATING MATERIAL COMPOSITION FOR UV-LED AND USE OF PHOSPHORIC ACID BASED CATALYST THEREFOR

CROSS-REFERENCE TO RELATED APPLICATION

This application is a Section 371 of International Application No. PCT/JP2015/051946, filed Jan. 20, 2015, which was published in the Japanese language on Aug. 6, 2015 under International Publication No. WO 2015/115344 A1, and the disclosure of which is incorporated herein by reference.

TECHNICAL FIELD

The present invention relates to a polysilsesquioxane based encapsulating material composition for UV-LED and use of phosphoric acid based catalyst therefor.

BACKGROUND ART

Patent Document 1 discloses an encapsulating material produced by using aluminum acetylacetonate as a cure accelerator for a condensation type silicone encapsulating material.

PRIOR ART DOCUMENTS

Patent Documents

Patent Document 1: JP-A-2007-112975

SUMMARY OF THE INVENTION

Problems to be Solved by the Invention

However, such an encapsulating material has absorption in the UV range and hence has not been necessarily satisfactory as an encapsulating material for UV-LED.

Means for Solving the Problems

The present invention includes the inventions described in the following [1] and [2].
[1] Use of a phosphoric acid-based catalyst as a cure accelerator for a polysilsesquioxane-based UV-LED-encapsulating material a cured product of which has a light transmittance of 653 or more at 260 nm.
[2] A polysilsesquioxane-based UV-LED-encapsulating material composition comprising a polysilsesquioxane-based UV-LED-encapsulating material and a phosphoric acid-based catalyst.

Effect of the Invention

According to the present invention, there are provided a polysilsesquioxane-based encapsulating material composition suitable for encapsulating an element which emits light in the ultraviolet range (in particular, UV-C range) and use of a phosphoric acid-based catalyst therefor.

MODE FOR CARRYING OUT THE INVENTION

Figure 1:
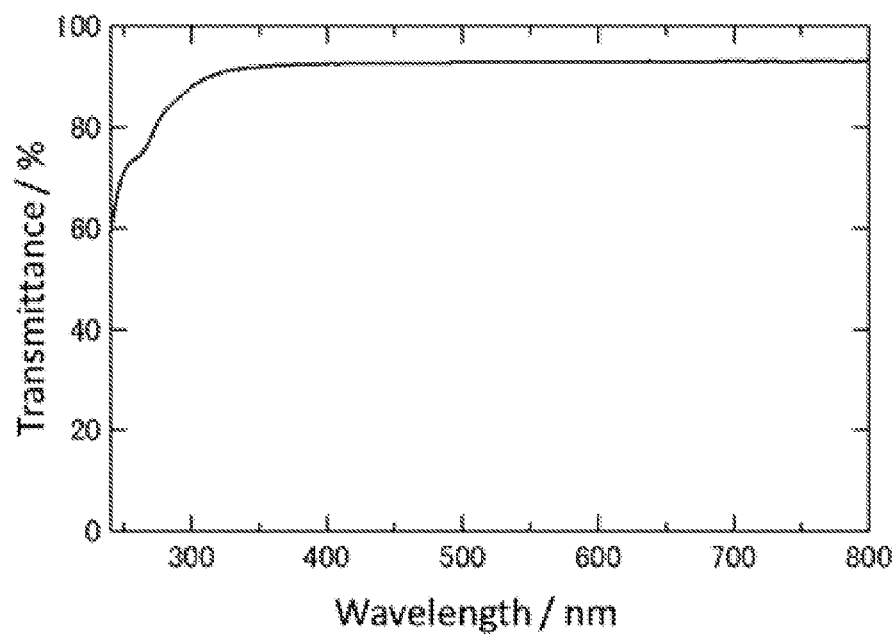
FIG. 1 is a result of ultraviolet visible transmittance measurement of a cured product produced in Example 1.

Hereinafter, the present invention will be explained in detail.

Polysilsesquioxane-Based Encapsulating Material

In the present invention, the polysilsesquioxane-based encapsulating material includes, for example, polysilsesquioxane described in "Polysilsesquioxane.T-resin" on a website of AZmax Co., Ltd. or the like.
<URL: http://www.azmax.co.jp/cnt_catalog_chemical/pdf/attach_2011 0517_135825.pdf>

An example of the polysilsesquioxane-based encapsulating material is an encapsulating material comprising a resin A having an organopolysiloxane structure represented by the formula (1).

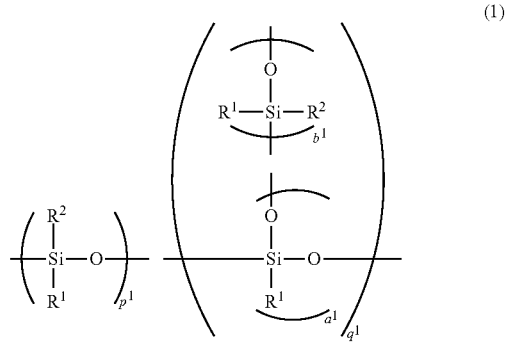

(1)

(In the formula, $R^1$ each independently represents an alkyl group; $R^2$ each independently represents an alkoxy group or a hydroxyl group; and $p^1$, $q^1$, $a^1$ and $b^1$ represent positive numbers satisfying $[p^1+b^1 \times q^1]:[a^1 \times q^1]=1:0.25$ to 9.)

Further, it is more preferable that the encapsulating material comprises an oligomer B having an organopolysiloxane structure represented by the formula (2), and a mixing ratio of the resin A and the oligomer B is resin A:oligomer B=100:0.1 to 20 (mass ratio). By comprising the resin A as a major component, the encapsulating material provides an effect of suppressing deterioration caused by ultraviolet light and improving heat resistance.

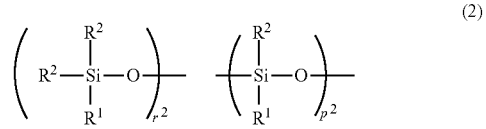

(2)

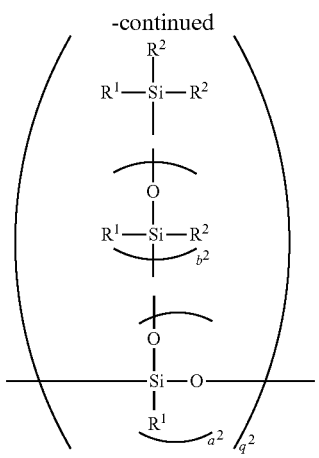

(In the formula, $R^1$ and $R^2$ represent the same meaning as in the formula (1); and $p^2$, $q^2$, $r^2$, $a^2$ and $b^2$ represent numbers equal to or larger than 0 satisfying $[a^2 \times q^2]/[(p^2+b^2 \times q^2)+a^2 \times q^2+(r^2+q^2)]=0$ to 0.3.)

The alkyl group represented by $R^2$ may be in a straight-chain form or a branched-chain form, or may have a cyclic structure. An alkyl group in a straight-chain form or a branched-chain form is preferable, and an alkyl group in a straight-chain form is more preferable. The number of carbon atoms in the alkyl group is not limited. The number is preferably 1 to 10, more preferably 1 to 6, further more preferably 1 to 3, and particularly preferably 1.

$R^2$ each independently represents an alkoxy group or a hydroxyl group.

When $R^2$ is an alkoxy group, the alkoxy group may be in a straight-chain form or a branched-chain form, or may have a cyclic structure. An alkoxy group in a straight-chain form or a branched-chain form is preferable, and an alkoxy group in a straight-chain form is more preferable. The number of carbon atoms in the alkoxy group is not limited. The number is preferably 1 to 3, more preferably 1 to 2, and further preferably 1.

The plurality of $R^1$ and $R^2$ may each be the same kind of a group or may be groups that are different from each other.

The resin A is preferably a resin having, as $R^1$, one or more kinds selected from the group consisting of a methyl group and an ethyl group, and having, as $R^2$, one or more kinds selected from the group consisting of a methoxy group, an ethoxy group, an isopropoxy group and a hydroxyl group. The resin A is more preferably a resin having, as $R^1$, one or more kinds selected from the group consisting of a methyl group and an ethyl group, and having, as $R^2$, a hydroxyl group and one or more kinds selected from the group consisting of a methoxy group, an ethoxy group and an isopropoxy group.

The weight-average molecular weight (Mw) of the resin A is typically 1500 to 8000. When the weight-average molecular weight of the resin A satisfies such a range, the moldability on curing is improved. The weight-average molecular weight of the resin A is preferably 1500 to 7000, more preferably 2000 to 5000.

The resin A can be synthesized, for example, by using, as a starting material, an organic silicon compound corresponding to each of the aforementioned repeating units and having a functional group capable of generating a siloxane bond. The "functional group capable of generating a siloxane bond" may be, for example, a halogen atom, a hydroxyl group or an alkoxy group. The organic silicon compound may be, for example, organotrihalosilane or organotrialkoxysilane. The resin A can be synthesized through reaction by the hydrolysis condensation method using these starting materials in a ratio corresponding to an existence ratio of each repeating unit. As the resin A, it is also possible to use a resin which is industrially commercially available as a silicone resin, an alkoxy oligomer or the like.

The oligomer B is preferably an oligomer having, as $R^1$, one or more kinds selected from the group consisting of a methyl group and an ethyl group, and having, as $R^2$, one or more kinds selected from the group consisting of a methoxy group, an ethoxy group, an isopropoxy group and a hydroxyl group. The oligomer B is more preferably an oligomer having a methyl group as $R^1$ and having a methoxy group or a hydroxyl group as $R^2$.

The weight-average molecular weight of the oligomer B is typically less than 1500. When the weight-average molecular weight of the oligomer B satisfies such a range, the moldability on curing is improved. The weight-average molecular weight of the oligomer B is preferably 200 or more and less than 1500, more preferably 250 to 1000.

The oligomer B can be synthesized, for example, by using, as a starting material, an organic silicon compound corresponding to each of the aforementioned repeating units constituting the oligomer B and having a functional group capable of generating a siloxane bond. The "functional group capable of generating a siloxane bond" represents the same meaning as the one described above. The organic silicon compound, for example, may be organotrihalosilane or organotrialkoxysilane. The oligomer B can be synthesized through reaction by the hydrolysis condensation method using these starting materials in a ratio corresponding to an existence ratio of each repeating unit.

The difference in weight-average molecular weight from the resin A can also be controlled, for example, by controlling the reaction temperature in subjecting the starting materials to hydrolysis condensation reaction or the speed of adding the starting materials into the reaction system. As the oligomer B, it is also possible to use an oligomer that is industrially commercially available as a silicone resin, an alkoxy oligomer or the like.

The weight-average molecular weights of the resin A and the oligomer B can be measured by using a commercially available GPC apparatus and using polystyrene as a standard.

The polysilsesquioxane-based uncured encapsulating material may be used by being dissolved in a solvent in order to facilitate the potting onto an element that has been placed on a substrate. At this time, it is good to make an adjustment so that the viscosity of an obtained solution at 25° C. may become 10 mPa·s to 10000 mPa·s.

The solvent only needs to be one which can respectively dissolve the uncured encapsulating materials which are put to use, and examples thereof include ketone solvents such as acetone and methyl ethyl ketone; alcohol solvents such as methanol, ethanol, isopropyl alcohol and normal propyl alcohol; hydrocarbon solvents such as hexane, cyclohexane, heptane and benzene; acetate solvents such as methyl acetate and ethyl acetate; ether solvents such as diethyl ether and tetrahydrofuran; glycol ether solvents such as ethylene glycol monomethyl ether, ethylene glycol monoethyl ether, ethylene glycol monoisopropyl ether, ethylene glycol monobutyl ether, ethylene glycol monohexyl ether, ethylene glycol monoethylhexyl ether, ethylene glycol monophenyl ether, ethylene glycol monobenzyl ether, diethylene glycol monomethyl ether, diethylene glycol monoethyl ether, diethylene glycol monoisopropyl ether, diethylene glycol monobutyl ether, diethylene glycol monohexyl ether, diethylene glycol monoethylhexyl ether, diethylene glycol monophenyl ether, diethylene glycol monobenzyl ether, propylene glycol monomethyl ether, propylene glycol monoethyl ether, propylene glycol monoisopropyl ether, propylene glycol monobutyl ether, propylene glycol monohexyl ether, propylene glycol, monoethylhexyl ether, propylene glycol monophenyl ether, propylene glycol monobenzyl ether, dipropylene glycol monomethyl ether, dipropylene glycol monoethyl ether, dipropylene glycol monoisoproyl ether, dipropylene glycol, monobutyl ether, dipropylene glycol monohexyl ether, dipropylene glycol monoethylhexyl ether, dipropylene glycol monophenyl ether and dipropylene glycol monobenzyl ether; and glycol ester solvents produced by adding an acetic acid group to the glycol ether solvents mentioned above, such as ethylene glycol monoethyl ether acetate, ethylene glycol monoisopropyl ether acetate, ethylene glycol monobutyl ether acetate, ethylene glycol monohexyl ether acetate, ethylene glycol monoethylhexyl ether acetate, ethylene glycol monophenyl ether acetate and ethylene glycol monobenzyl ether acetate; and others.

The polysilsesquioxane-based encapsulating material may be used either alone as one kind or in combination of two or more kinds.

<Cure Accelerator>

The cure accelerator in the present invention is a phosphoric acid-based catalyst. The phosphoric acid-based catalyst is a compound represented by the following formula (3) or (4).

(3)

(4)

(In the formula, M represents a counter cation. The symbol * represents another atom or atomic group. The number n is an integer of 0 to 2. When there are a plurality of M, these may each be the same or may be different from each other. When there are a plurality of *, these may each be the same or may be different from each other.)

The aforementioned counter cation may be, for example, a hydrogen ion. The atom or atomic group represented by * includes, for example, OR or R. R represents a monovalent organic group.

Specific examples of the phosphoric acid-based catalyst include phosphoric acid, phosphorous acid, phosphate and phosphite.

The cure accelerator may be used by being diluted with a solvent. Examples of the diluting solvent which can be used include general organic solvents; silicone oils such as liquid alkoxysilane and dimethylsiloxane; and others.

The amount of use of the cure accelerator is typically 0.01% by mass to 10% by mass, preferably within a range of 0.01% by mass to 1% by mass, more preferably 0.05% by mass to 1% by mass, relative to the polysilsesquioxane-based encapsulating material.

It is preferable that the cure accelerator is prepared as a solution separate from the resin A and the oligomer B, and these solutions are mixed before use and thereafter used.

The cure accelerator may be used either alone as one kind or in combination of two or more kinds.

<Curing of Encapsulating Material>

Use of the present invention is carried out typically by potting the uncured encapsulating material, which comprises the polysilsesquioxane-based encapsulating material and the cure accelerator described above, onto the element that has been placed on the substrate, and subsequently curing the encapsulating material. In other words, a method of encapsulating an element for UV-LED by use of the present invention includes a first step of placing the element onto a substrate, a second step of potting a polysilsesquioxane-based encapsulating material composition, which comprises the polysilsesquioxane-based encapsulating material and the following solvent a, onto the element which has been placed on the substrate in the first step, and a third step of curing the polysilsesquioxane-based encapsulating material that has been potted in the second step.

The placing of the element onto the substrate is carried out by an ordinary method. Other constituent members that are usually needed in the semiconductor light-emitting device, such as an electrode and an interconnect, may be placed as well.

The above potting is typically carried out by supplying the uncured encapsulating material onto the substrate with an exclusive-use dispenser. The amount of supplied uncured encapsulating material differs depending on the structure, the area, and the volume of the substrate, the element and the like, and in addition, the structure of the electrode, the wire interconnect or the like. The amount of supplied uncured encapsulating material is preferably an amount capable of embedding these element and wire interconnect and capable of setting the thickness of the encapsulating material which covers over the light-emitting element to be as small as possible, more preferably an amount that gives a thickness of 2 mm or less. It is effective to make the thickness of the encapsulating material on the light-emitting element be small because that tendency is conspicuous particularly in a power LED for visible light having a light emission output current of 100 mA or more, a UV-LED that emits ultraviolet rays having a wavelength of 350 nm or less and the like that are being increasingly developed in recent years.

As the curing conditions, it is sufficient to set the temperature and the time such that an ordinary polycondensation reaction occurs. Specifically, in air under atmospheric pressure, the temperature is preferably 100 to 200° C., more preferably 120 to 200° C. The time is preferably 1 to 5 hours. Also, the curing may be carried out by raising the curing temperature in a stepwise manner in order to effectively promote the volatilization of residual solvent in the encapsulating material, the polycondensation reaction, and the like.

The light transmittance of the cured product at 260 nm is 65% or more, preferably 68% or more, and more preferably 70 to 93%.

EXAMPLES

The devices and measurement conditions used in the ultraviolet visible transmittance measurement described in the following Examples are as follows.

<Ultraviolet Visible Transmittance Measurement>

Device name: UV-3600 manufactured by Shimadzu Corporation

Attachment: integrating sphere ISR-3100

Measurement wavelength: 220 to 800 nm

Background measurement: ambient atmosphere

Measurement speed: middle speed

A resin (A-1) having an organopolysiloxane structure represented by the above formula (1) (Mw=3500, in the above formula (1), $R^1$=methyl group, $R^2$=methoxy group or hydroxyl group) was used as the resin A. The existence ratio of each of the repeating units of the resin (A-1) is shown in Table 1.

An oligomer (B-1) having an organopolysiloxane structure represented by the above formula (2) (Mw=450, in the above formula (2), $R^1$=methyl group, $R^2$=methoxy group) was used as the oligomer B. The existence ratio of each of the repeating units of the oligomer (B-1) is shown in Table 2.

TABLE 1

| Repeating unit | $\left(\begin{array}{c} OCH_3 \\ | \\ -Si-O- \\ | \\ CH_3 \end{array}\right)$ | $\left(\begin{array}{c} OH \\ | \\ -Si-O- \\ | \\ CH_3 \end{array}\right)$ | $\left(\begin{array}{c} Si \\ | \\ O \\ | \\ -Si-O- \\ | \\ CH_3 \end{array}\right)$ |
|---|---|---|---|
| Existence ratio | 0.08 | 0.15 | 0.77 |

TABLE 2

| Repeating unit | $\left(\begin{array}{c} OCH_3 \\ | \\ H_3CO-Si-O- \\ | \\ CH_3 \end{array}\right)$ | $\left(\begin{array}{c} OCH_3 \\ | \\ -Si-O- \\ | \\ CH_3 \end{array}\right)$ | $\left(\begin{array}{c} Si \\ | \\ O \\ | \\ -Si-O- \\ | \\ CH_3 \end{array}\right)$ |
|---|---|---|---|
| Existence ratio | 0.39 | 0.49 | 0.12 |

Example 1

Into a flask that had been placed in a water bath, 135 g of the resin (A-1) and 72.7 g of isopropyl alcohol were added. The mixture was stirred while heating until the inner temperature became 85° C., so as to dissolve the resin (A-1). Subsequently, 15 g of the oligomer (B-1) was added, and the resultant was stirred for no less than one hour to dissolve the oligomer (B-1), thereby obtaining a mixture.

To the obtained mixture, 47.2 g of 2-butoxyethyl acetate was added. Thereafter, with use of an evaporator, isopropyl alcohol was distilled off under conditions with a temperature of 80° C. and a pressure of 4 kPaA until the isopropyl alcohol concentration became 1% by mass or less, thereby yielding a polysilsesquioxane-based encapsulating material composition (α1) in which the mixing ratio of the resin (A-1) and the oligomer (B-1) was 90:10 (mass ratio).

To 100 parts by mass of the polysilsesquioxane-based encapsulating material composition (α1), 2 parts by mass of a catalyst for curing comprising 15% by mass of phosphoric acid with the rest part being dimethylpolysiloxane having a methoxy group at both terminal ends (3 to 5 repeating units) were added, followed by stirring and mixing sufficiently, thereby producing a polysilsesquioxane-based encapsulating material composition (α1-1). Thereafter, about 3.8 g of the composition (α1-1) was put into a cup made of aluminum. Further, the temperature was raised from room temperature up to 150° C. at a speed of 3.7° C./minute in an oven, and the resultant was left to stand at 150° C. for 5 hours, thereby producing a cured product of the polysilsesquioxane-based encapsulating material composition (α1-1). The thickness of the produced cured product was 1.7 mm. The result of ultraviolet visible transmittance measurement of this cured product is shown in FIG. 1.

Example 2

Figure 2:
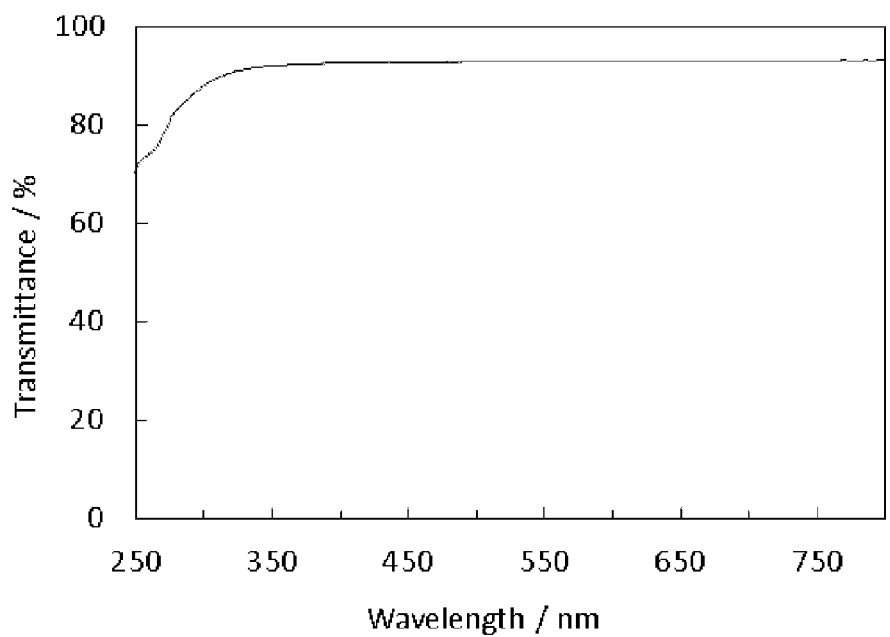
FIG. 2 is a result of ultraviolet visible transmittance measurement of a cured product produced in Example 2.

To 100 parts by mass of the polysilsesquioxane-based encapsulating resin composition (α1) which had been prepared in the same manner as in Example 1, 2 parts by mass of a catalyst for curing comprising 15% by mass of a mixture of monomethyl phosphate and dimethyl phosphate (AP-1 manufactured by Daihachi Chemical Industry Co., Ltd.) with the rest part being 2-butoxyethyl acetate were added, followed by mixing while sufficiently stirring, thereby producing a polysilsesquioxane-based encapsulating material composition (α1-2). Thereafter, about 3.8 g of the composition (α1-2) was put into a cup made of aluminum. Further, the temperature was raised from room temperature up to 150° C. at a speed of 3.7° C./minute in an oven, and the resultant was left to stand at 150° C. for 5 hours, thereby producing a cured product of the polysilsesquioxane-based encapsulating material composition (α1-2). The thickness of the produced cured product was 1.7 mm. The result of ultraviolet visible transmittance measurement of this cured product is shown in FIG. 2.

Comparative Example 1

Into a flask, 12.7 g of methyltrimethoxysilane, 11.2 g of dimethyldimethoxysilane, 3.3 g of methanol, 8.1 g of water, and 4.8 g of a 5% by mass acetylacetone aluminum salt methanol solution were put, and the flask was tightly plugged. While stirring with a stirrer, the resultant was heated in a hot-water bath of 50° C. for 8 hours, and the temperature was lowered back to room temperature, so as to prepare a resin liquid.

Figure 3:
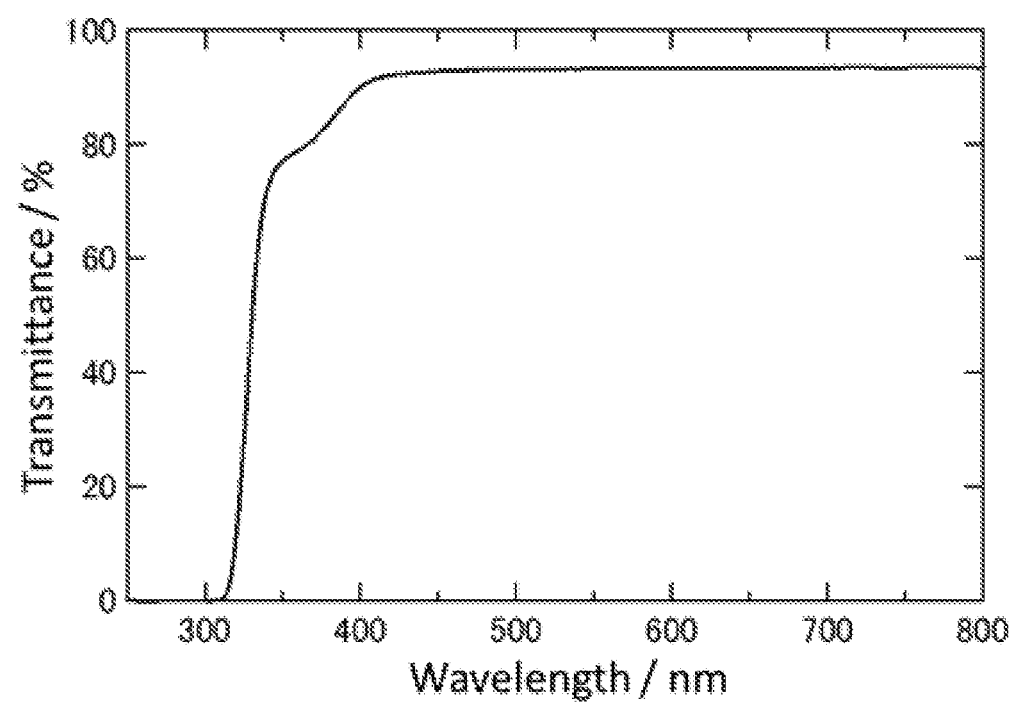
FIG. 3 is a result of ultraviolet visible transmittance measurement of a cured product produced in Comparative Example 1.

Into a Teflon (trademark) petri dish having a diameter of 5 cm, 7.3 g of this resin liquid was put, and the resultant was held at 40° C. for 4 hours. Subsequently, the temperature was raised up to 65° C. in 3 hours. Subsequently, the temperature was raised up to 150° C. in 1 hour, and the resultant was held at 150° C. for 3 hours, thereby producing a cured product. The thickness of the cured product at this time was 0.9 mm. The result of ultraviolet visible transmittance measurement is shown in FIG. 3.

The result of ultraviolet visible transmittance measurement of a cured product produced in each of Example 1, Example 2, and Comparative Example 1 is shown in Table 3.

TABLE 3

| | | ultraviolet visible transmittance/% | | | |
|---|---|---|---|---|---|
| | Cure accelerator | 260 nm | 300 nm | 340 nm | 380 nm |
| Example 1 | Phosphoric acid catalyst | 74.1 | 88.0 | 91.7 | 92.4 |
| Example 2 | Phosphate catalyst | 74.8 | 88.1 | 91.6 | 92.4 |
| Comparative Example 1 | Aluminum acetylacetonate | 9.0 | 0.0 | 72.2 | 83.9 |

INDUSTRIAL APPLICABILITY

The present invention is useful, for example, as an encapsulating material for UV-LED.

The invention claimed is:

1. A polysilsesquioxane-based UV-LED-encapsulating material composition comprising a polysilsesquioxane-based UV-LED-encapsulating material and a phosphoric acid-based catalyst, wherein
the polysilsesquioxane-based UV-LED-encapsulating material comprises a resin A having an organopolysiloxane structure represented by the formula (1):

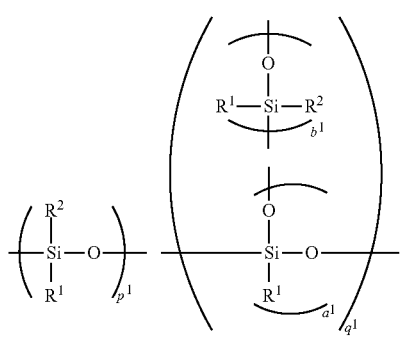

wherein each $R^1$ independently represents an alkyl group, each $R^2$ independently represents an alkoxy group or a hydroxyl group, and $p^1$, $q^1$, $a^1$ and $b^1$ represent positive numbers satisfying $[p^1+b^1 \times q^1]:[a^1 \times q^1]=1:0.25$ to 9,
wherein a polystyrene-equivalent weight-average molecular weight of the resin A is 1500 to 8000, and
wherein an amount of the phosphoric acid-based catalyst is 0.05% by mass to 1% by mass relative to the polysilsesquioxane-based UV-LED-encapsulating material.

2. A method of curing a polysilsesquioxane-based UV-LED-encapsulating material, the method comprising using a phosphoric acid-based catalyst as a cure accelerator for the curing, such that a resulting cured product has a light transmittance of 65% or more at 260 nm, wherein the polysilsesquioxane-based UV-LED-encapsulating material comprises a resin A having an organopolysiloxane structure represented by formula (1):

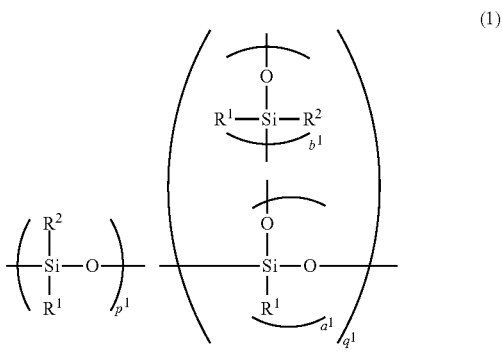

wherein each $R^1$ independently represents an alkyl group, each $R^2$ independently represents an alkoxy group or a hydroxyl group, and $p^1$, $q^1$, $a^1$ and $b^1$ represent positive numbers satisfying $[p^1+b^1 \times q^1]:[a^1 \times q^1]=1:0.25$ to 9,
wherein a polystyrene-equivalent weight-average molecular weight of the resin A is 1500 to 8000, and
wherein an amount of the phosphoric acid-based catalyst is 0.05% by mass to 1% by mass relative to the polysilsesquioxane-based UV-LED-encapsulating material.

3. The polysilsesquioxane-based UV-LED-encapsulating material composition according to claim 1, wherein the polysilsesquioxane-based UV-LED-encapsulating material further comprises an oligomer B having an organopolysiloxane structure represented by formula (2):

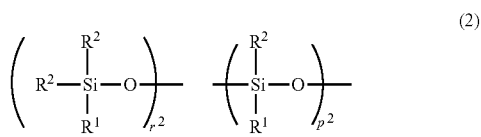

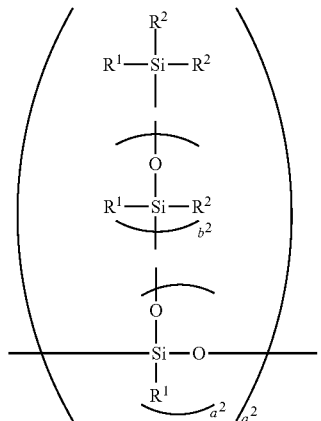

wherein $R^1$ and $R^2$ represent the same meaning as in the formula (1) and $p^2$, $q^2$, $r^2$, $a^2$ and $b^2$ represent numbers equal to or larger than 0 satisfying $[a^2 \times q^2]/[(p^2+b^2 \times q^2)+a^2 \times q^2+(r^2+q^2)]=0$ to 0.3.

4. The polysilsesquioxane-based UV-LED-encapsulating material composition according to claim 1, wherein $R^1$ is an alkyl group having one carbon atom.

5. The polysilsesquioxane-based UV-LED-encapsulating material composition according to claim 1, wherein $R^1$ is a methyl group or an ethyl group, and $R^2$ is a methoxy group, an ethoxy group, an isopropoxy group or a hydroxyl group.

6. The polysilsesquioxane-based UV-LED-encapsulating material composition according to claim 1, wherein the polystyrene-equivalent weight-average molecular weight of the resin A is 2000 to 5000.

7. The polysilsesquioxane-based UV-LED-encapsulating material composition according to claim 3, wherein the polystyrene-equivalent weight-average molecular weight of the oligomer B is 250 to 1000.

8. The method of curing a polysilsesquioxane-based UV-LED-encapsulating material according to claim 2, wherein the polysilsesquioxane-based UV-LED-encapsulating material further comprises an oligomer B having an organopolysiloxane structure represented by the formula (2):

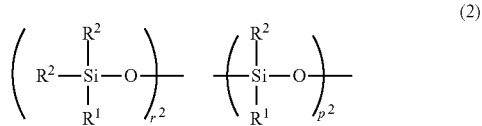

-continued

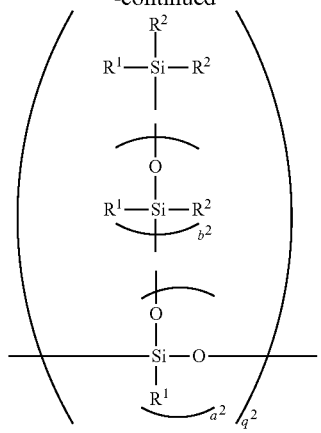

wherein $R^1$ and $R^2$ represent the same meaning as in the formula (1) and $p^2$, $q^2$, $r^2$, $a^2$ and $b^2$ represent numbers equal to or larger than 0 satisfying $[a^2 \times q^2]/[(p^2+b^2 \times q^2)+a^2 \times q^2+(r^2+q^2)]=0$ to 0.3.

9. The method of curing a polysilsesquioxane-based UV-LED-encapsulating material according to claim 2, wherein $R^1$ is an alkyl group having one carbon atom.

10. The method of curing a polysilsesquioxane-based UV-LED-encapsulating material according to claim 2, wherein $R^1$ is a methyl group or an ethyl group, and $R^2$ is a methoxy group, an ethoxy group, an isopropoxy group or a hydroxyl group.

11. The method of curing a polysilsesquioxane-based UV-LED-encapsulating material according to claim 2, wherein the polystyrene-equivalent weight-average molecular weight of the resin A is 2000 to 5000.

12. The method of curing a polysilsesquioxane-based UV-LED-encapsulating material according to claim 8, wherein the polystyrene-equivalent weight-average molecular weight of the oligomer B is 250 to 1000.

* * * * *